(12) United States Patent
Wilson

(10) Patent No.: US 8,193,857 B1
(45) Date of Patent: Jun. 5, 2012

(54) WIDEBAND DOHERTY AMPLIFIER CIRCUIT

(75) Inventor: Richard Wilson, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/037,813

(22) Filed: Mar. 1, 2011

(51) Int. Cl.
  *H03F 3/68* (2006.01)
(52) U.S. Cl. .............. 330/124 R; 330/295; 330/302
(58) Field of Classification Search .......... 330/124 R, 330/295, 302
  See application file for complete search history.

(56) References Cited

U.S. PATENT DOCUMENTS

| | | | | |
|---|---|---|---|---|
| 3,419,813 | A * | 12/1968 | Kamnitsis | 330/295 |
| 4,323,855 | A * | 4/1982 | Gerlach | 331/56 |
| 5,973,557 | A * | 10/1999 | Miyaji et al. | 330/51 |
| 7,260,157 | B2 * | 8/2007 | Hagh et al. | 375/297 |
| 7,616,061 | B2 * | 11/2009 | Cha et al. | 330/295 |
| 2010/0001802 | A1 * | 1/2010 | Blednov | 330/295 |

OTHER PUBLICATIONS

Nitronex Corporation, Wideband Doherty Amplifier for WiMAX, Application Note AN-003, Sep. 2007.

Qureshi, J. H. et al., "A Wide-Band 20W LMOS Doherty Power Amplifier", IEEE 2010, pp. 1504-1507.
Kim, B, et al., Efficiency Enhancement of Linear Power Amplifier Using Load Modulation Technique, Department of Electronic and Electrical Engineering and Microwave Application Reserach Center, POSTECH, Korea.
Sarkeshi, M., et al., A Novel Configuration for the Doherty Amplifier for Load Modulation Enhancement and Bandwidth Improvement, pp. 246-249.

* cited by examiner

*Primary Examiner* — Patricia Nguyen
(74) *Attorney, Agent, or Firm* — Murphy, Bilak & Homiller, PLLC

(57) ABSTRACT

An amplifier circuit includes a signal summing node, a first amplifier configured to operate in a first mode, an impedance inverter, a second amplifier configured to operate in a second mode and a wideband impedance transformer. The impedance inverter couples an output of the first amplifier to the signal summing node. The impedance inverter is configured to provide impedance transformation and load modulation to the first amplifier. The second amplifier has an output coupled to the signal summing node. The wideband impedance transformer has a first end coupled to the signal summing node and a second end forming a terminal node. The wideband impedance transformer is configured to present a real impedance to the first amplifier over at least 25% of a radio frequency bandwidth of the amplifier circuit.

24 Claims, 6 Drawing Sheets

WIDEBAND DOHERTY AMPLIFIER CIRCUIT

BACKGROUND

A typical Doherty amplifier has a main (carrier) amplifier biased to operate in a linear mode such as Class AB and a peaking amplifier biased to operate in a non-linear mode such as Class C. The signal input to the Doherty amplifier is split to each amplifier, and the amplified signals are recombined with an output combining network. Both amplifiers are operational when the input signal peaks, and are each presented with a load impedance that enables maximum power output. As the input signal decreases in power, the peaking amplifier turns off and only the main amplifier operates. At these lower power levels, the main amplifier is presented with a modulated load impedance that enables higher efficiency and gain. This results in an efficient solution for amplifying complex modulation schemes employed in current and emerging wireless systems e.g. such as WCDMA (Wideband CDMA), CDMA2000, and systems employing Orthogonal Frequency Division Multiplexing (OFDM), such as WiMAX (Worldwide Interoperability for Microwave Access) and the Long-Term Evolution (LTE) enhancement to the UMTS (Universal Mobile Telecommunications System) standard.

Traditional Doherty amplifier architectures are limited in radio frequency bandwidth because frequency dependant elements such as ¼ wavelength transmission lines are used in the output combining network. Accordingly, Doherty amplifiers are typically designed to operate within a specific narrow frequency band. For example, within the telecommunication field, the operating bandwidth is typically between 1-5% of the RF signal frequency. However, from a carrier perspective, a multiple band amplifier has significant cost benefits. Multiple band amplifiers can not be realized with a traditional Doherty implementation because of the frequency-limited elements present in the output combining network. For example, the Doherty combiner VSWR (voltage standing wave ratio) in the Zmod condition changes in response to small changes in the operating frequency band. As such, several traditional Doherty amplifiers must be used for wideband applications, with each amplifier designed for a specific narrow band within the wideband frequency range.

SUMMARY

According to an embodiment of an amplifier circuit, the amplifier circuit includes a signal summing node, a first amplifier configured to operate in a first mode, an impedance inverter, a second amplifier configured to operate in a second mode and a wideband impedance transformer. The impedance inverter couples an output of the first amplifier to the signal summing node. The impedance inverter is configured to provide impedance transformation and load modulation to the first amplifier. The second amplifier has an output coupled to the signal summing node. The wideband impedance transformer has a first end coupled to the signal summing node and a second end forming a terminal node. The wideband impedance transformer is configured to present a real impedance to the first amplifier over at least 25% of a radio frequency bandwidth of the amplifier circuit.

According to a corresponding embodiment of a method of operating the amplifier circuit, the method includes coupling the output of the first amplifier to the signal summing node via the impedance inverter, operating the first amplifier in the first mode and providing impedance transformation and load modulation to the first amplifier via the impedance inverter. The method further includes coupling the output of the second amplifier to the signal summing node, operating the second amplifier in the second mode, coupling the first end of the wideband impedance transformer to the signal summing node, coupling the second end of the wideband impedance transformer to a terminal impedance and presenting a real impedance to the first amplifier over at least 25% of a radio frequency bandwidth of the amplifier circuit.

According to another embodiment of an amplifier circuit, the amplifier circuit includes a signal summing node, a main amplifier, a transmission line, a peaking amplifier and a wideband impedance transformer. The transmission line couples an output of the main amplifier to the signal summing node. The output of the peaking amplifier is also coupled to the signal summing node, and the wideband impedance transformer has a wider end coupled to the signal summing node and a narrower end which forms a terminal node.

According to a corresponding embodiment of a method of operating the amplifier circuit, the method includes coupling the output of the main amplifier to the signal summing node via the transmission line operating the main amplifier in a first mode, and coupling the output of the peaking amplifier to the signal summing node. The method further includes operating the peaking amplifier in a second mode, coupling the wider end of the wideband impedance transformer to the signal summing node, coupling the narrower end of the wideband impedance transformer to a terminal impedance and transforming between real impedances present at the ends of the wideband impedance transformer over at least 25% of a radio frequency bandwidth of the amplifier circuit.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
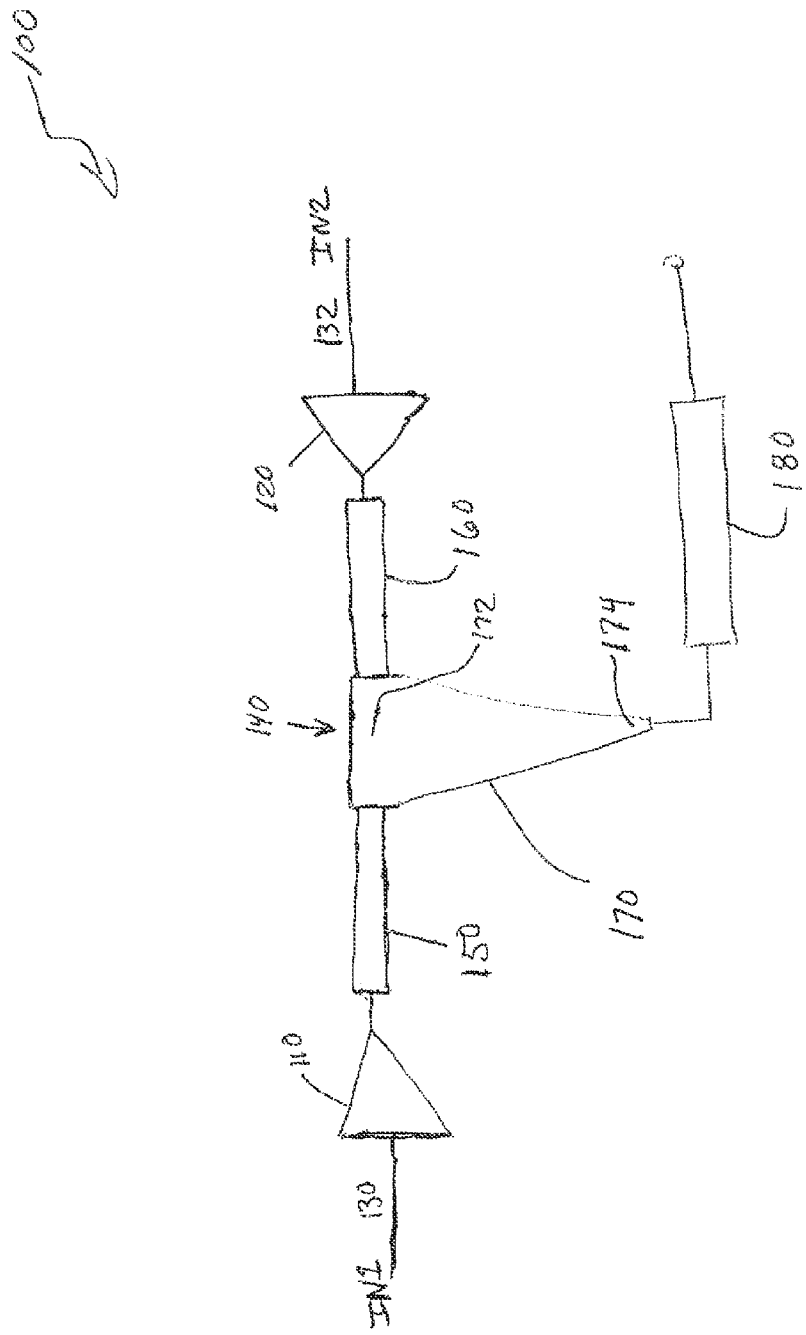
FIG. 1 illustrates an embodiment of an amplifier circuit including a wideband impedance transformer.

FIG. 1 illustrates an embodiment of an amplifier circuit 100. The amplifier circuit 100 includes a first amplifier 110 and a second amplifier 120. The first amplifier 110 is configured to operate in a first mode and the second amplifier 120 is configured to operate in a second mode. In one embodiment, the first amplifier 110 is a main (or carrier) amplifier biased to operate in a linear mode such as Class AB and the second amplifier 120 is a peaking amplifier biased to operate in a non-linear mode such as Class C, and therefore the amplifier circuit 100 functions as a Doherty amplifier according to this embodiment.

The signal inputs (IN1, IN2) 130, 132 are applied with the required amplitude and phase delta to provide optimal output combining at a summing junction 140. An impedance inverter 150 couples the output of the first amplifier 110 to the signal summing node 140. The impedance inverter 150 has an input impedance inversely proportional to the load impedance. As such, the impedance inverter 150 provides impedance transformation to the first amplifier 110, and load modulation to the first amplifier 110 when the second amplifier 120 is not operating. The output of the second amplifier 120 is likewise coupled to the signal summing node 140. According to the embodiment shown in FIG. 1, a non-inverting impedance matching network 160 such as two ¼ wavelength transmission lines couples the output of the second amplifier 120 to the signal summing node 140. The impedance inverter 150 can be a ¼ wavelength transmission line. In other embodiments, the impedance inverter 150 is a lumped LC inverter.

The impedance inverter 150 and the non-inverting impedance matching network 160 are frequency dependant elements, and therefore can be considered narrowband in that the amplifier circuit response will be variable over a wide radio frequency bandwidth unless the effect of the frequency dependant elements is mitigated. The frequency-dependent variability can be reduced by providing a wideband impedance transformer 170 that presents most of the impedance transformation to the first amplifier 110. The impedance inverter 150 therefore presents a relatively smaller portion of the impedance transformation to the first amplifier 110, greatly reducing the frequency variability in the amplifier circuit response.

The wideband impedance transformer 170 has a first end 172 coupled to the signal summing node 140 and a second end 174 which forms a terminal node of the amplifier circuit 100. The terminal node can be coupled to a terminal impedance 180 e.g. such as a 50Ω or 75Ω load. The wideband impedance transformer 170 presents a real impedance (e.g. presuming a return loss greater than 15 dB) to the first amplifier 110 over at least 25% of the radio frequency bandwidth of the amplifier circuit 100. For example, the wideband impedance transformer 170 can present a real impedance to the first amplifier 110 over at least 200 MHz or more when the amplifier circuit operates in the hundreds of MHz range. The real impedance can be presented over at least 1 GHz or more when the amplifier circuit operates in the multiple GHz range. In some embodiments, the wideband impedance transformer 170 presents a real impedance over at least 30% of the radio frequency bandwidth of the amplifier circuit 100. A real impedance is provided over such a wide frequency band due to the wideband structure of the impedance transformer 170, which includes a tapered shape with a relatively wide end 172 coupled to the signal summing node 140 and a relatively narrow opposing end 174 coupled to the terminal impedance 180.

The cross-sectional width of the wider end 172 of the wideband impedance transformer 170 may be limited by the physical constraints of the medium used to house or support the amplifier circuit 100. For example, the wideband impedance transformer 170 can be fabricated in the same dielectric as the first and second amplifiers 110, 120, or formed on a carrier supporting the amplifiers 110, 120 such as a printed circuit board, ceramic substrate, or electronic package. In each case, corresponding design rules and/or costs may influence the maximum size of the larger end 172 of the wideband impedance transformer 170. The impedance inverter 150 electrically coupled between the wide end 172 of the wideband impedance transformer 170 can be used for additional impedance transformation if desired.

Figure 2:
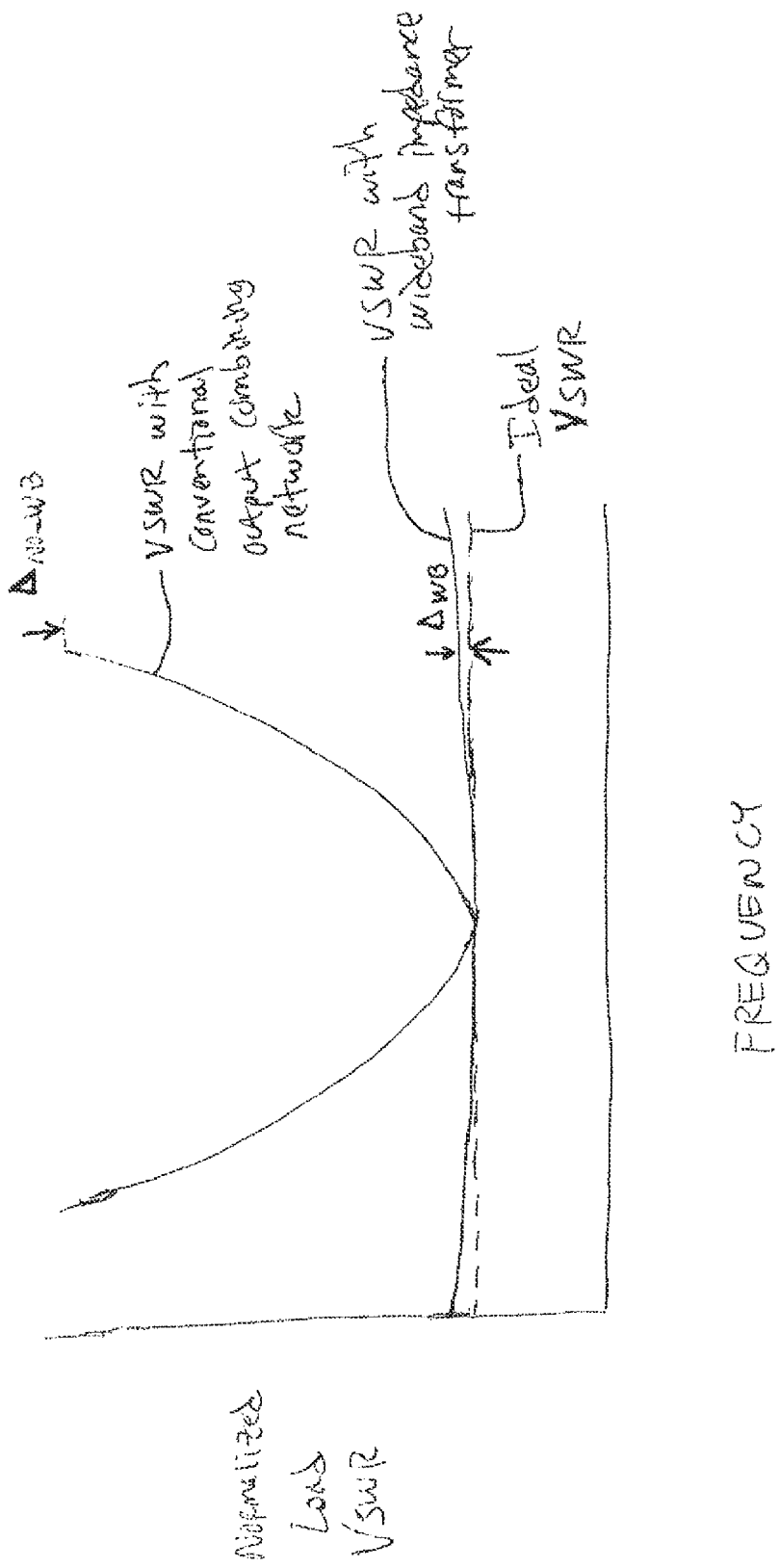
FIG. 2 is a graph illustrating the performance of the amplifier circuit shown in FIG. 1.

FIG. 2 graphically illustrates the effect of the real impedance presented to the first amplifier 110 by the wideband impedance transformer 170 over a wide radio frequency bandwidth, as measured by normalized load VSWR (voltage standing wave ratio). The graph shows an ideal VSWR with no variation over the radio frequency bandwidth of interest, the VSWR which results by using the wideband impedance transformer 170 described herein and the VSWR that results with a conventional output combining network. Simulation results show the standard symmetric Doherty combiner and matching network in conjunction with a 3 Ohm device results in Zopt achieving a Zmod bandwidth of 3.9% using a normalized load VSWR of 1.2 as the specification limit. Under the same test conditions, the wideband Doherty combiner disclosed herein achieves a 33.4% bandwidth given the same impedance transformation ratio, specification limits and center frequency of operation.

The VSWR varies little over the 400 MHz frequency bandwidth by using the wideband impedance transformer 170 because the wideband impedance transformer 170 provides most of the impedance transformation to the first amplifier 110, and therefore the frequency-dependent variability in the amplifier circuit response is significantly reduced. As such, the impedance inverter 150 that couples the output of the first amplifier 110 to the signal summing node 140 provides less impedance transformation to the first amplifier 110 compared to conventional Doherty amplifiers. This is highly beneficial for wideband frequency operation since the impedance inverter 150 e.g. a ¼ wavelength transmission line has frequency limitations not present in the wideband impedance transformer 170. Therefore, the wideband impedance transformer 170 presents the bulk of the impedance transformation to the first amplifier 110 during power back-off (i.e. when the second amplifier is not operating) while the impedance inverter 150 provides impedance inversion and some of the impedance transformation. In one embodiment, the wideband impedance transformer 170 provides at least 90% of the total impedance transformation presented to the first amplifier 110 and the impedance inverter 150 provides the remainder. The frequency range over which a real impedance is presented is a function of the geometry of the wideband impedance transformer 170.

The wideband impedance transformer 170 can be tapered as shown in FIG. 1, with the first end 172 coupled to the signal summing node 140 being wider than the second end 174 so that the wideband transformer 170 provides the desired real impedance transformation. In a purely illustrative and non-limiting example, the wideband impedance transformer 170 can transform a real 50Ω terminal impedance at its narrower end 174 to a lower real impedance at the opposing wider end 172 during power back-off and to a higher effective real impedance during peak power (i.e. when both the first and second amplifiers 110, 120 are operational) due to the current contribution from the peaking amplifier 120.

Figure 3:
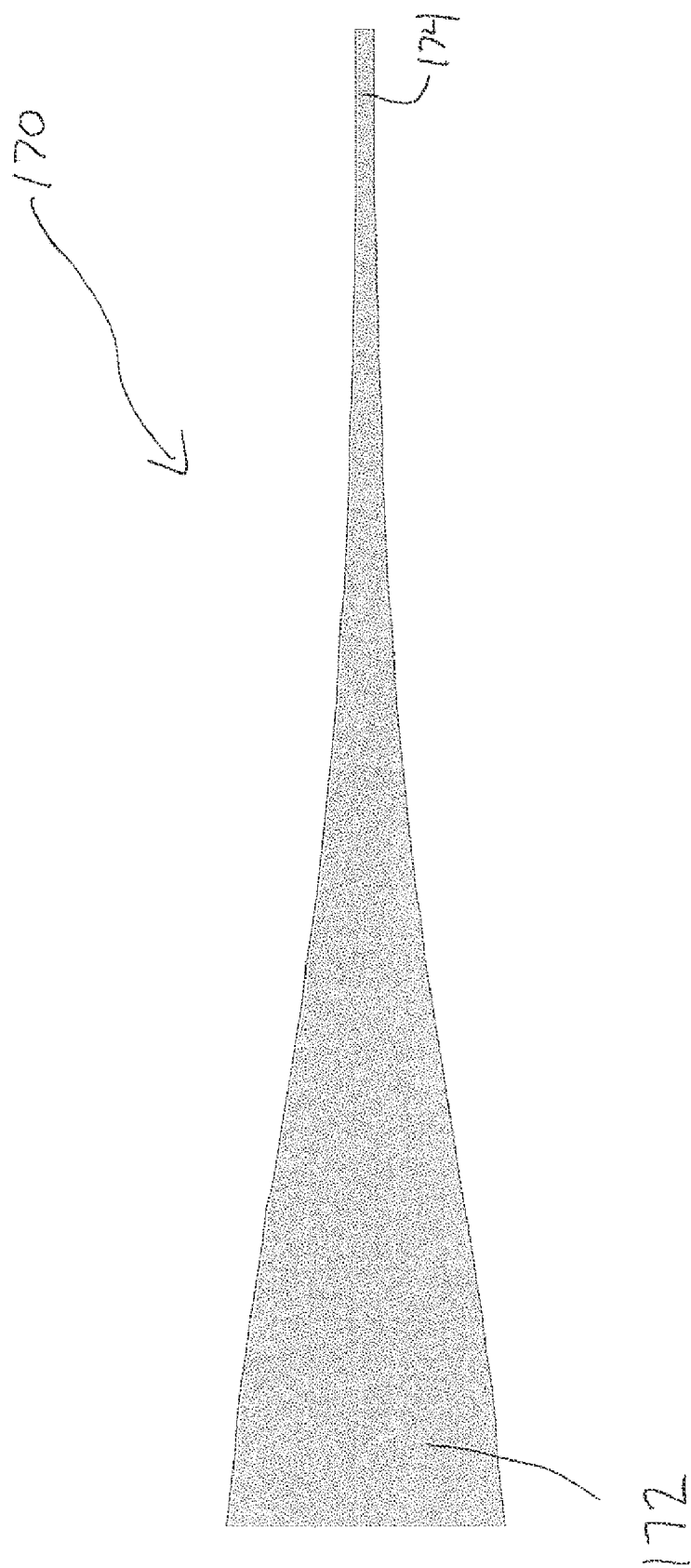
FIG. 3 illustrates an embodiment of a wideband impedance transformer.

FIG. 3 illustrates another embodiment of the wideband impedance transformer 170. The taper of the wideband impedance transformer 170 is gradual from the wider end 172 to the narrower end 174 of the wideband impedance transformer 170 according to this embodiment.

Figure 4:
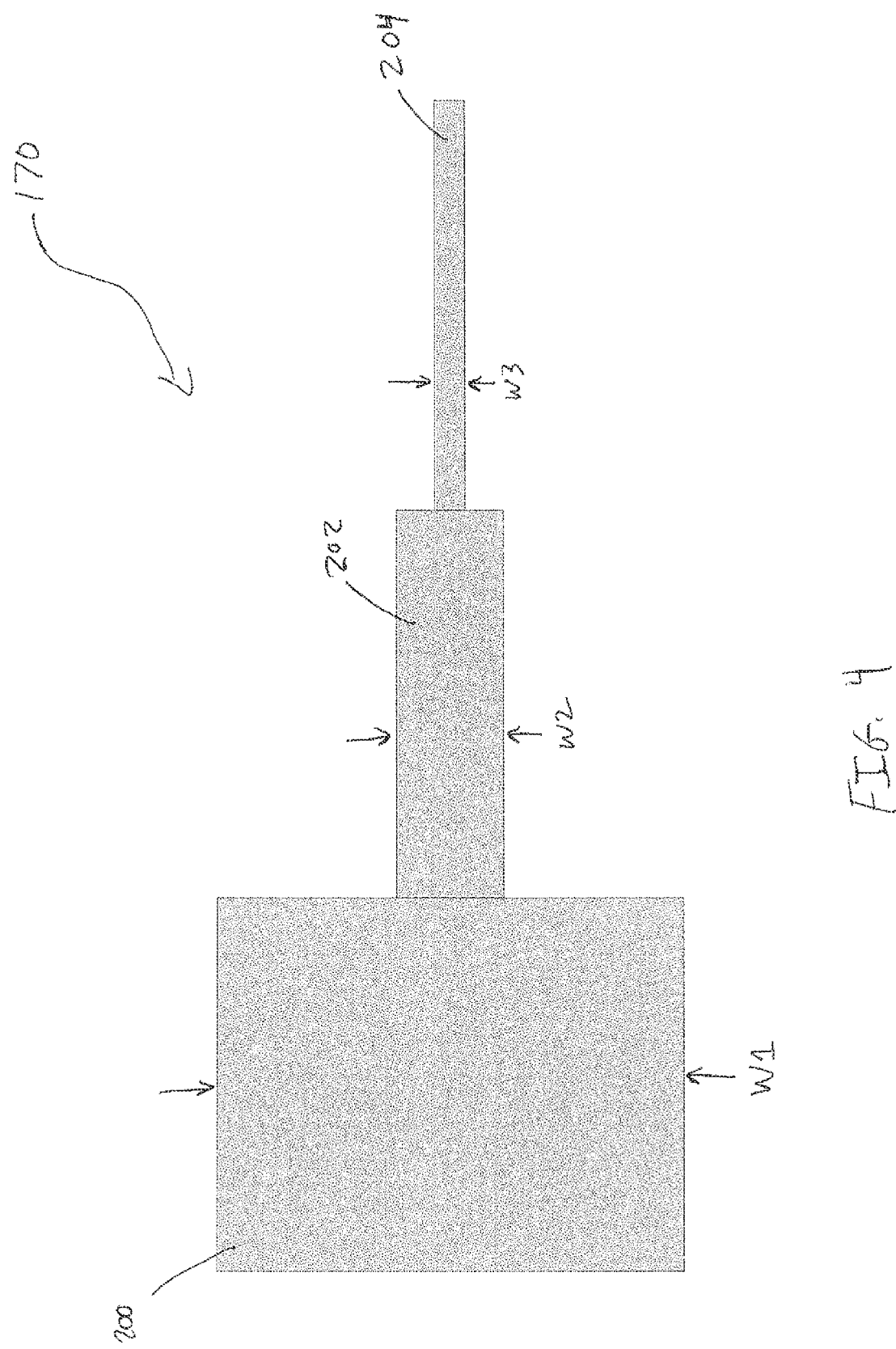
FIG. 4 illustrates another embodiment of a wideband impedance transformer.

FIG. 4 illustrates yet another embodiment of the wideband impedance transformer 170. The wideband impedance transformer 170 includes three sections 200, 202, 204 according to this embodiment, and the taper of the wideband impedance transformer 170 changes abruptly between the different sections. Particularly, the first section 200 of the wideband impedance transformer 170 is the widest end and has a first cross-sectional width (W1). The middle section 202 is the next widest section and has a second cross-sectional width (W2). The narrowest section 204 has a third cross-sectional width (W3). The cross-sectional width W1 of the first section 200 is greater than the cross-sectional width W2 of the middle section 202, and the cross-sectional width of the middle section 202 is greater than the cross-sectional width W3 of the narrowest section 204. In addition, the transition between sections is abrupt as shown in FIG. 4.

Figure 5:
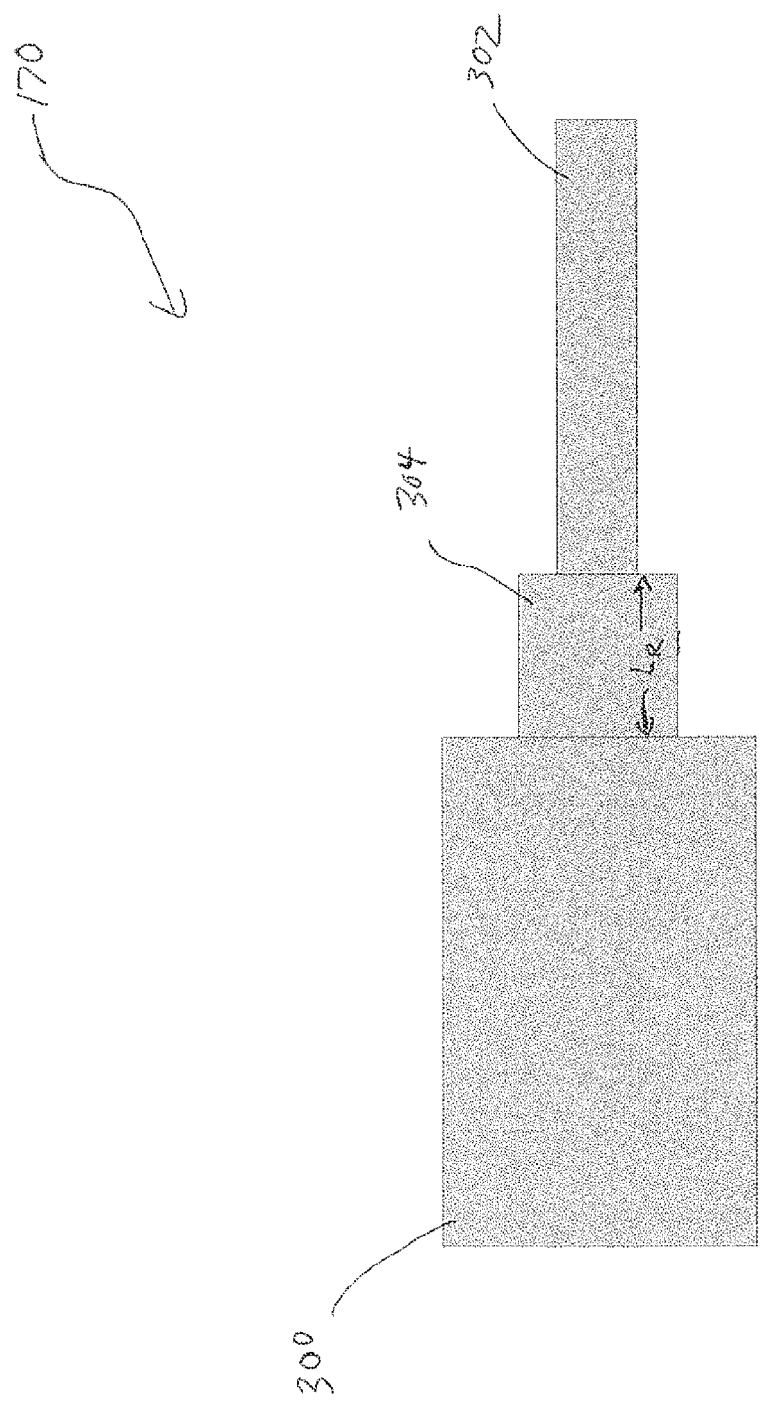
FIG. 5 illustrates yet another embodiment of a wideband impedance transformer.

FIG. 5 illustrates still another embodiment of the wideband impedance transformer 170. The wideband impedance transformer 170 includes two end sections 300, 302 according to this embodiment, and the taper of the wideband impedance transformer 170 changes abruptly between the sections. A geometric mean rotator 304 is interposed between the first and second sections 300, 302 of the wideband impedance transformer 170. The length ($L_R$) of the geometric mean rotator 304 is less than that of the middle section of the wideband impedance transformer 170, and therefore provides impedance rotation but no substantial real impedance transformation. In general, the wideband impedance transformer 170 can be made with multiple discrete steps where the number of steps increases the bandwidth.

The amplifier circuit 100 of FIG. 1 is operated by coupling the output of the first amplifier 110 to the signal summing node 140 via the impedance inverter 150. According to one embodiment, the impedance inverter 150 is a ¼ wavelength transmission line having one end connected to the wider end 172 of the wideband impedance transformer 170 at the signal summing node 140 and the opposing end connected to the output of the first amplifier 110. The first amplifier 110 is operated in a first mode e.g. such as Class AB. Some impedance transformation is presented to the first amplifier 110 by the impedance inverter 150. The impedance inverter 150 also provides load modulation to the first amplifier 110 during power back-off. The amplifier circuit 100 is further operated by coupling the output of the second amplifier 120 to the signal summing node 140, operating the second amplifier 120 in a second mode e.g. such as Class C, coupling the wider end 172 of the wideband impedance transformer 170 to the signal summing node 140 and coupling the narrower end 174 of the wideband impedance transformer 170 to a terminal impedance.

Figure 6:
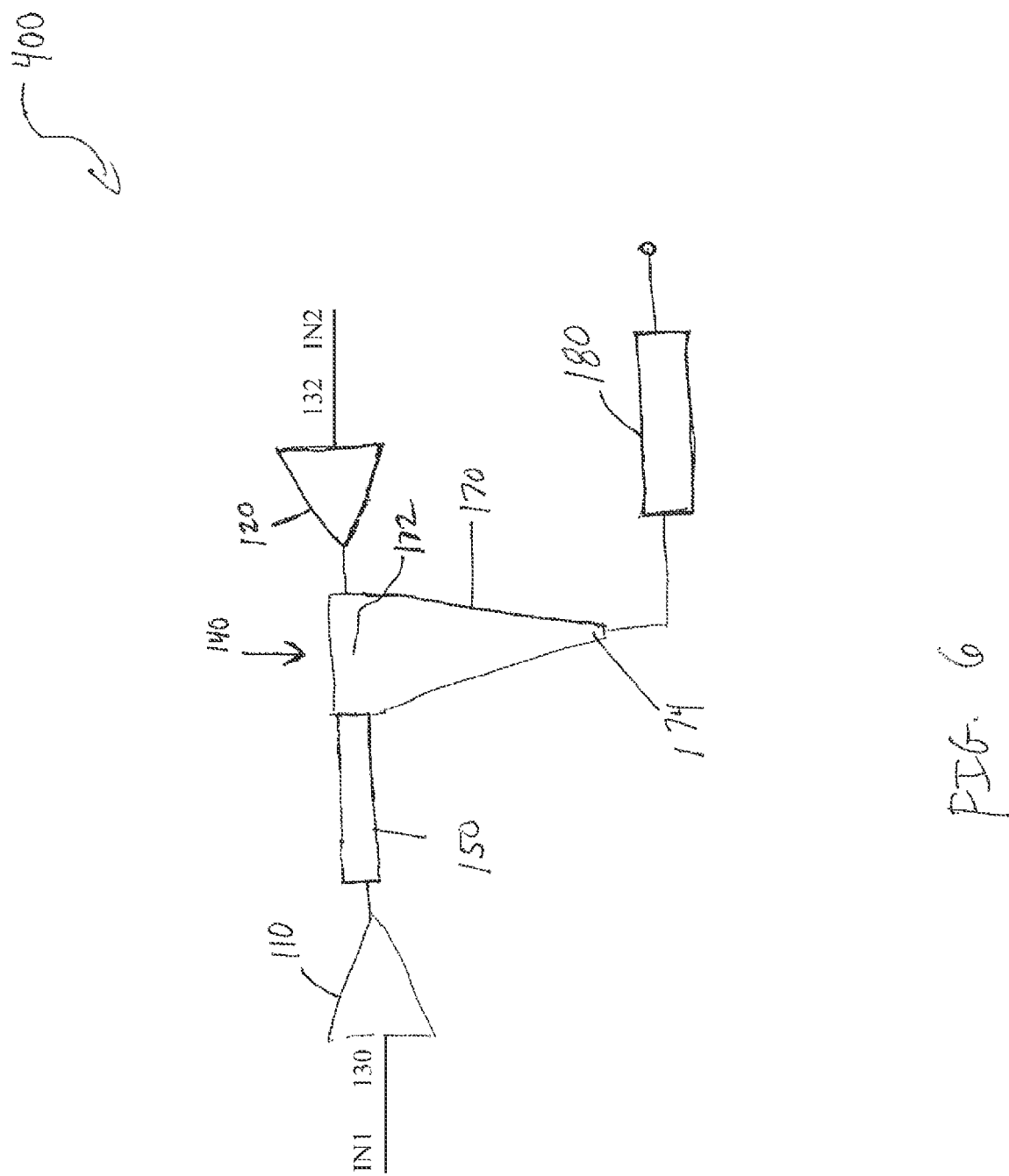
FIG. 6 illustrates another embodiment of an amplifier circuit including a wideband impedance transformer.

FIG. 6 illustrates another embodiment of an amplifier circuit 400. The embodiment shown in FIG. 6 is similar to the one shown in FIG. 1, except the output of the second amplifier 120 is directly connected to the wider end 172 of the wideband impedance transformer 170 at the signal summing node 140. Accordingly, no impedance transformer is electrically interposed between the wideband impedance transformer 170 and the output of the second amplifier 120. As such, the impedance match for the peaking amplifier 120 is absorbed into the wideband impedance transformer 170.

The amplifier circuit 400 is operated according to one embodiment by coupling the output of the first amplifier 110 to the signal summing node 140 via the impedance inverter 150. The first amplifier 110 operates in a first mode e.g. such as Class AB. Impedance transformation and load modulation are provided to the main amplifier 110 via the impedance inverter 150. The amplifier circuit 400 is further operated by coupling the output of the second amplifier 120 to the signal summing node 140, operating the second amplifier 140 in a second mode e.g. such as Class C, coupling the wider end 172 of the wideband impedance transformer 170 to the signal summing node 140 and coupling the narrower end 174 of the wideband impedance transformer 170 to a terminal impedance. The wideband impedance transformer 170 transforms between the real impedances present at the ends 172, 174 of the wideband impedance transformer 170 over the wideband radio frequency bandwidth of the amplifier circuit 400 as explained previously herein.

During peak power operation, both amplifiers 110, 120 see a load of Zopt provided by the impedance inverter 150 where Zopt for each stage is determined by the transformer impedance and the current contribution from both devices. If the current is the same, Zopt is twice the transformer impedance as described below. The wideband impedance transformer 170 transforms the terminal impedance present at its narrower end 174 to Zopt at its wider end 172 at peak power. During power back-off, the first amplifier 110 sees load modulation provided by the impedance inverter 150 and the second amplifier 120 is not operational. The wideband impedance transformer 170 transforms the terminal impedance at its narrower end 174 to Zopt/y at its wider end 172 at power back-off, where y corresponds to the inverse of the current in the first amplifier 110 during power back-off. In another embodiment, y=1+the ratio of the peaking amplifier power to the main amplifier power.

The embodiments described herein provide a load modulated amplifier without several of the band limiting elements included in the output match network of a traditional Doherty amplifier. The absence of these elements reduces loss in the output combining network, providing an increase in overall system efficiency. In some cases, the wideband elements can be lossy. The embodiments described herein also increase expected production repeatability since multiple cascaded narrow band elements are replaced with broadband structures. Furthermore, the wideband impedance transformer sets the system impedance and acts outside the load modulation area of the amplifier circuit. Accordingly, the wideband impedance transformer structures described herein may be used without consideration for the response under load modulation.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An amplifier circuit, comprising:
   a signal summing node;
   a first amplifier configured to operate in a first mode;
   an impedance inverter coupling an output of the first amplifier to the signal summing node, the impedance inverter configured to provide impedance transformation and load modulation to the first amplifier;
   a second amplifier configured to operate in a second mode, the second amplifier having an output coupled to the signal summing node; and
   a wideband impedance transformer having a first end coupled to the signal summing node and a second end forming a terminal node, the wideband impedance transformer configured to present a real impedance to the first amplifier over at least 25% of a radio frequency bandwidth of the amplifier circuit.

2. The amplifier circuit of claim 1, wherein the wideband impedance transformer is tapered with the first end coupled to the signal summing node being wider than the second end.

3. The amplifier circuit of claim 2, wherein the taper is gradual over a length of the wideband impedance transformer.

4. The amplifier circuit of claim 1, further comprising an impedance transformer coupling the output of the second amplifier to the signal summing node.

5. The amplifier circuit of claim 1, wherein the output of the second amplifier is directly connected to the first end of the wideband impedance transformer at the signal summing node.

6. The amplifier circuit of claim 1, wherein the wideband impedance transformer is configured to provide the real impedance over at least 30% of the radio frequency bandwidth of the amplifier circuit.

7. The amplifier circuit of claim 1, wherein the impedance inverter is a ¼ wavelength transmission line having a first end connected to the first end of the wideband impedance transformer at the signal summing node and a second end connected to the output of the main amplifier.

8. A method of operating an amplifier circuit including a signal summing node, a first amplifier and a second amplifier, the method comprising:
coupling an output of the first amplifier to the signal summing node via an impedance inverter;
operating the first amplifier in a first mode;
providing impedance transformation and load modulation to the first amplifier via the impedance inverter;
coupling an output of the second amplifier to the signal summing node;
operating the second amplifier in a second mode;
coupling a first end of a wideband impedance transformer to the signal summing node;
coupling a second end of the wideband impedance transformer to a terminal impedance; and
presenting a real impedance to the first amplifier via the wideband impedance transformer over at least 25% of a radio frequency bandwidth of the amplifier circuit.

9. The method of claim 8, comprising coupling the output of the second amplifier to the signal summing node via an impedance transformer.

10. The method of claim 8, comprising directly connecting the output of the second amplifier to the first end of the wideband impedance transformer at the signal summing node.

11. The method of claim 8, comprising providing the real impedance via the wideband impedance transformer over at least 30% of the radio frequency bandwidth of the amplifier circuit.

12. An amplifier circuit, comprising:
a signal summing node;
a main amplifier;
a transmission line coupling an output of the main amplifier to the signal summing node;
a peaking amplifier having an output coupled to the signal summing node; and
a wideband impedance transformer having a wider end coupled to the signal summing node and a narrower end which forms a terminal node.

13. The amplifier circuit of claim 12, wherein the main amplifier and the peaking amplifier are configured to experience a load Zopt at full power and the main amplifier is configured to experience load modulation at power back-off.

14. The amplifier circuit of claim 13, wherein the wideband impedance transformer is configured to transform a terminal impedance present at the narrower end of the wideband impedance transformer to Zopt/y at the wider end during power back-off, where y corresponds to the inverse of the current in the main amplifier during power back-off.

15. The amplifier circuit of claim 12, wherein the transmission line is ¼ wavelength with a first end connected to the output of the main amplifier and a second end connected to the wider end of the wideband impedance transformer at the signal summing node.

16. The amplifier circuit of claim 12, wherein the wideband impedance transformer comprises at least two different sections with different widths.

17. The amplifier circuit of claim 12, wherein the wideband impedance transformer comprises opposing end sections with different widths and a geometric mean rotator interposed between the end sections.

18. The amplifier circuit of claim 12, wherein the wideband impedance transformer is configured to transform between two real impedances over a radio frequency bandwidth of the amplifier circuit.

19. The amplifier circuit of claim 18, wherein the wideband impedance transformer is configured to transform between the two real impedances over at least 25% of a radio frequency bandwidth of the amplifier circuit.

20. A method of operating an amplifier circuit including a signal summing node, a main amplifier and a peaking amplifier, the method comprising:
coupling an output of the main amplifier to the signal summing node via a transmission line;
operating the main amplifier in a first mode;
coupling an output of the peaking amplifier to the signal summing node;
operating the peaking amplifier in a second mode;
coupling a wider end of a wideband impedance transformer to the signal summing node;
coupling a narrower end of the wideband impedance transformer to a terminal impedance; and
transforming between real impedances present at the ends of the wideband impedance transformer over at least 25% of a radio frequency bandwidth of the amplifier circuit.

21. The method of claim 20, comprising:
subjecting the main amplifier and the peaking amplifier to a load Zopt at full power; and
subjecting the main amplifier to load modulation at power back-off.

22. The method of claim 21, comprising transforming the terminal impedance present at the narrower end of the wideband impedance transformer to Zopt/y at the wider end of the wideband impedance transformer during the power back-off, where y=1+the ratio of peaking amplifier power to main amplifier power.

23. The method of claim 20, comprising connecting a first end of the transmission line to the output of the main amplifier and a second end of the transmission line to the wider end of the wideband impedance transformer at the signal summing node.

24. The method of claim 20, comprising transforming between the real impedances present at the ends of the wideband impedance transformer over at least 30% of the radio frequency bandwidth of the amplifier circuit.

* * * * *